United States Patent [19]

Ishii

[11] Patent Number: 4,639,894
[45] Date of Patent: Jan. 27, 1987

[54] DATA TRANSFERRING METHOD

[75] Inventor: Chiharu Ishii, Kanagawa, Japan

[73] Assignee: Fuji Xerox Co., Ltd., Tokyo, Japan

[21] Appl. No.: 705,001

[22] Filed: Feb. 25, 1985

[30] Foreign Application Priority Data

Feb. 25, 1984 [JP] Japan ................... 59-33374

[51] Int. Cl.$^4$ .............................................. G11C 7/00
[52] U.S. Cl. .................... 365/189; 365/230
[58] Field of Search ............ 365/189, 214, 220, 221, 365/230, 233, 239, 240

[56] References Cited

U.S. PATENT DOCUMENTS 3,906,461 9/1975 Cappon ..................... 365/189 X
4,354,256 10/1982 Miyasaka ..................... 365/189

Primary Examiner—Joseph A. Popek
Attorney, Agent, or Firm—Finnegan, Henderson, Farabow, Garrett & Dunner

[57] ABSTRACT

A method of improving data transfer speed for a word-organized memory arranged by rows and columns. The method includes the steps of selecting a first row of the memory and transferring all the bits in the first row of the memory to a set of registers. A second row of the memory is then selected and the contents of all the registers are transferred to the second row of the memory. The invention may also be for transferring rows of data between memories.

12 Claims, 6 Drawing Figures

DATA TRANSFERRING METHOD

BACKGROUND OF THE INVENTION

1. Field of the Invention

This invention relates to an improved method and arrangement for transferring data within a memory or between different memories.

2. Description of the Prior Art

In data processing equipment, either the central processing unit (CPU), or a direct memory access controller (DMAC) controls reading and writing data into memory.

FIG. 1 shows a circuit in which a CPU 11 directly controls a memory 12. While writing data, the CPU 11 places a control line 13 in a write state and uses an address bus 14 to specify an address of a memory location into which data are to be written. A data bus 15, which is eight bits wide in this example, is used to transfer data into the memory 12.

FIG. 2 shows a circuit with a DMAC 16 controlling a memory. The circuit in FIG. 2 is an improvement over that in FIG. 1 since the DMAC decreases the load on the CPU.

FIG. 3 illustrates an arrangement of a memory 12. In the examples shown in FIGS. 1–4, it is assumed that the memory 12 address are ten bits long and data are stored in eight bit memory words. The memory 12 has a word-organized memory cell assembly 21 in which memory cells are arranged in a matrix form of 128 rows×8 columns×8 bits/column. Memory assembly 21 is considered to be word-organized since each memory location, specified by a unique row and column number, contains a word, in this case of eight bits. A row or line decoder 22 receives the seven most significant bits of the address, bits $A_3 \ldots A_9$, to select one of the 128 linear rows. When a linear row is selected, assembly 21 outputs all 64 bits in that row. These bits are then fed into eight column decoders 23, each corresponding to a different bit of the word to be stored.

Each of the eight column decoders 23 receives the three least significant bits of the address, bits $A_0, A_1, A_2$, to select one out of the eight columns. The outputs from column decoders 23 are connected to lines $D_0$ through $D_7$ of data bus 15. When memory 12 receives a 10 bit address, it identifies the eight bit word selected by that address and transmits it to data bus 15. Lines $D_0$–$D_7$ can also be written into that identified word as well as having the contents of that selected word outputted to data bus 15 lines $D_0$–$D_7$.

In memory 12, to transfer all the data stored in one line of the memory cell assembly 21 (i.e., 64 bits) to another line in memory 12 or into another memory, the procedure is as follows:

(i) Line decoder 22 identifies the line from which the data are to be transferred.

(ii) Using control line 13, the data in the selected line are outputted to the data bus 15 8-bit word by 8-bit word, with the words being sequentially selected by the column decoders 23.

(iii) If the memory line to which data are transferred is in another memory, the data outputted to data bus 15 are transferred to the data bus for the other memory and written into that other memory word-by-word. If the memory line to which data are transferred is in the same memory, the data applied to data bus 15 are then stored in a register (not shown) word-by-word and are later written from that register back into the memory at the new line, again word-by-word.

As is evident, the conventional data transferring method described above is inefficient when the total amount of the data to be transferred has more bits than the width of the data bus, the data bus width typically being the same size as a memory word. In such a case, transferring the data word-by-word is slow. Therefore, the conventional data transferring method suffers in that it takes a relatively long period of time to transfer a large quantity of data between memory lines or rows. Such transfer occurs often, for example, when a word processor transfers sentences of text.

In view of the foregoing, an object of this invention is to provide a data transferring method in which data can be transferred quickly.

SUMMARY OF THE INVENTION

To achieve the foregoing object, and in accordance with the purposes of the invention as embodied and broadly described herein, a method of improving memory data transfer speed for a word-organized memory arranged by rows and columns and having for each row N columns and P bits per word is provided comprising the steps of selecting a first row of the memory and transferring all N×P bits in the first row of the memory to a set of P registers each having N words. A second row of the memory is selected to receive the transferred data and the contents of all the P registers are transferred to the selected row of the memory.

The invention further comprises a method for improving memory data transfer speed between a first and second word-organized memories arranged according to rows and column, each memory having for each row N columns and P bits per word. This method includes the steps of selecting a first row of the first memory and transferring all N×P bits in the first row of the first memory into P registers each having N words. A second row of the second memory is then selected to receive the transferred data and the contents of all the P registers are transferred into the second row of the second memory.

DESCRIPTION OF THE PREFERRED EMBODIMENT

Figure 1:
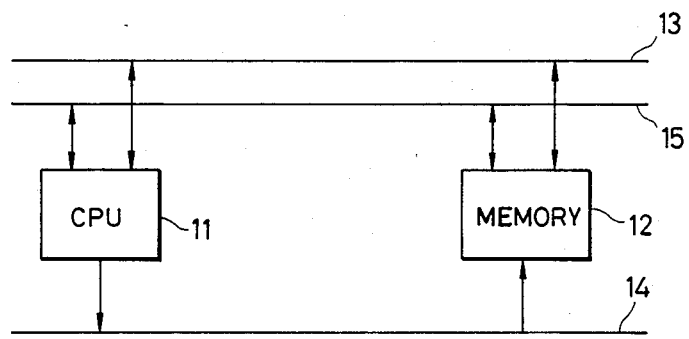
FIG. 1 is a diagram outlining the arrangement of a computer system in which a CPU directly controls memory access.
Figure 2:
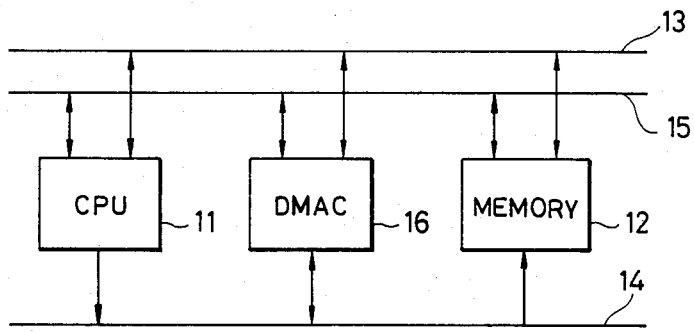
FIG. 2 is a diagram outlining the arrangement of a computer system in which a DMAC controls memory access.
Figure 3:
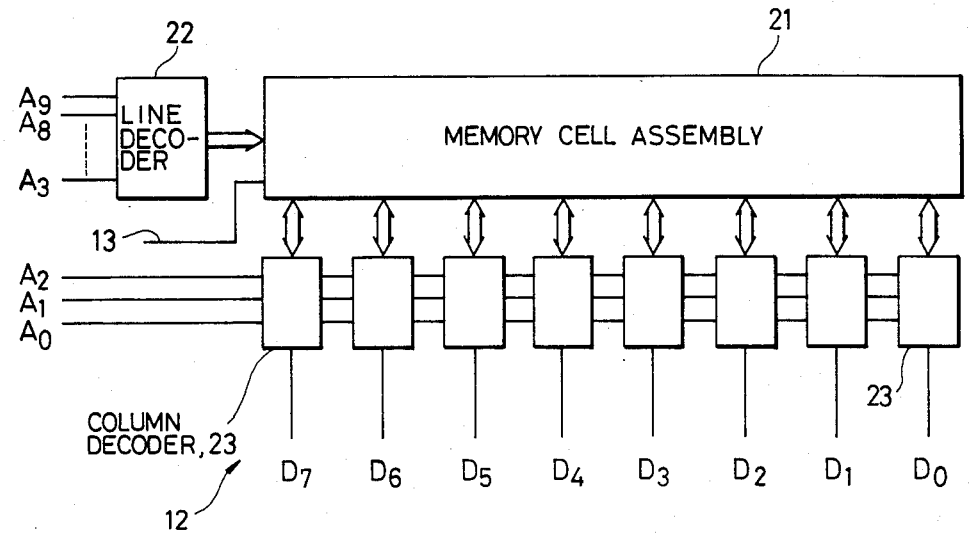
FIG. 3 is a diagram showing the arrangement of a memory for a description of a conventional data transferring method.
Figure 4:
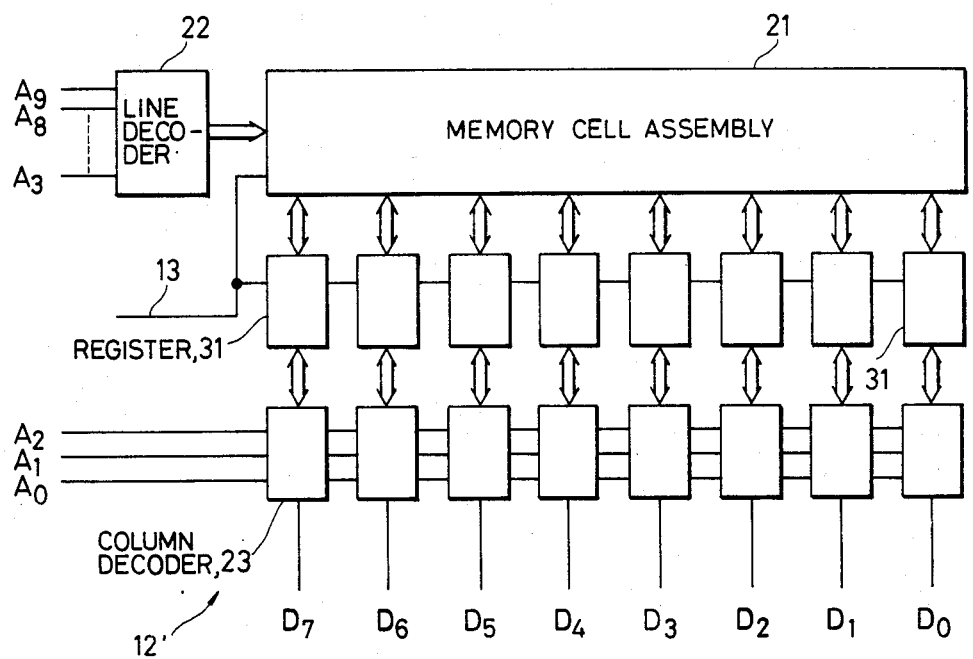
FIG. 4 is a diagram showing the arrangement of a memory for a description of a data transferring method according to the present invention.

FIG. 4 shows one example of a memory arrangement 12 for realizing a data transferring method within a single memory according to the present invention. In FIG. 4, those components which have been previously described in FIG. 3, particularly elements 13, 21, 22 and 23, are designated by the same reference numerals and their detailed descriptions are omitted.

As indicated in the discussion of FIG. 3, in the memory cell assembly 21, the memory cells are arranged in a matrix of 128×8 columns×8 bits. Data bus 15 with lines D0 through D7 input and output eight-bit data in parallel.

In memory 12', however, column decoders 23 are connected to the memory cell assembly 21 through registers 31. Registers 31 are also coupled to control line 13. The design of register 31 is well-known in the art. The number of registers 31, eight in FIG. 4, and the storage capability of those registers, eight bits, depends on the particular memory arrangement. The number of registers 32 depends on the number of bits per word, N, just as the number of column decoders does. In addition, the storage capacity of registers 31 depends on the number of columns, P.

Registers 31 each input and output their contents in parallel. Thus the set of registers 31 inputs and outputs N×P, or in the present example 8×8=64, bits simultaneously. This helps provide the present invention's advantages of greater data transfer speed.

In the memory 12' thus constructed, all the data in one line or row are transferred to another line as follows:

(i) First, based on address signals A3–A9, the line decoder 22 specifies the line from which the data are to be transferred and the control line 13 is placed in a read state. The data in the specified line is 64 bits wide and is divided into eight groups each including eight bits. The eight groups of data are read out and stored in parallel in the eight registers 31.

(ii) Next, after signals A3–A9 change to identify a new address, line decoder 22 specifies the line to which the data are to be transferred. Control line 13 is placed in a write state causing the bits stored in registers 31 to be written in parallel into the specified line.

(iii) If any words from memory 12' are read from data bus 15 or if words from data bus 15 are to be written into memory 12', signals A3–A9 identify the lines in assembly 21 and signals A0–A2 identify the selected column under control of control line 13. The transfer between bus 15 and memory 12' via decoders 23 and registers 31 then occurs on a word-by-word basis.

In the above-described embodiment, the 8 bits forming one word are each stored in a different one of the registers 32 in such a manner that the 8 bits are stored in the eight registers 31, respectively. However, the data may be stored in other units.

The operation of transferring data within a single memory has been described above. The method for transferring lines of data between memories is similar in that the data input and output to and from the memories take place through the registers.

Figure 5:
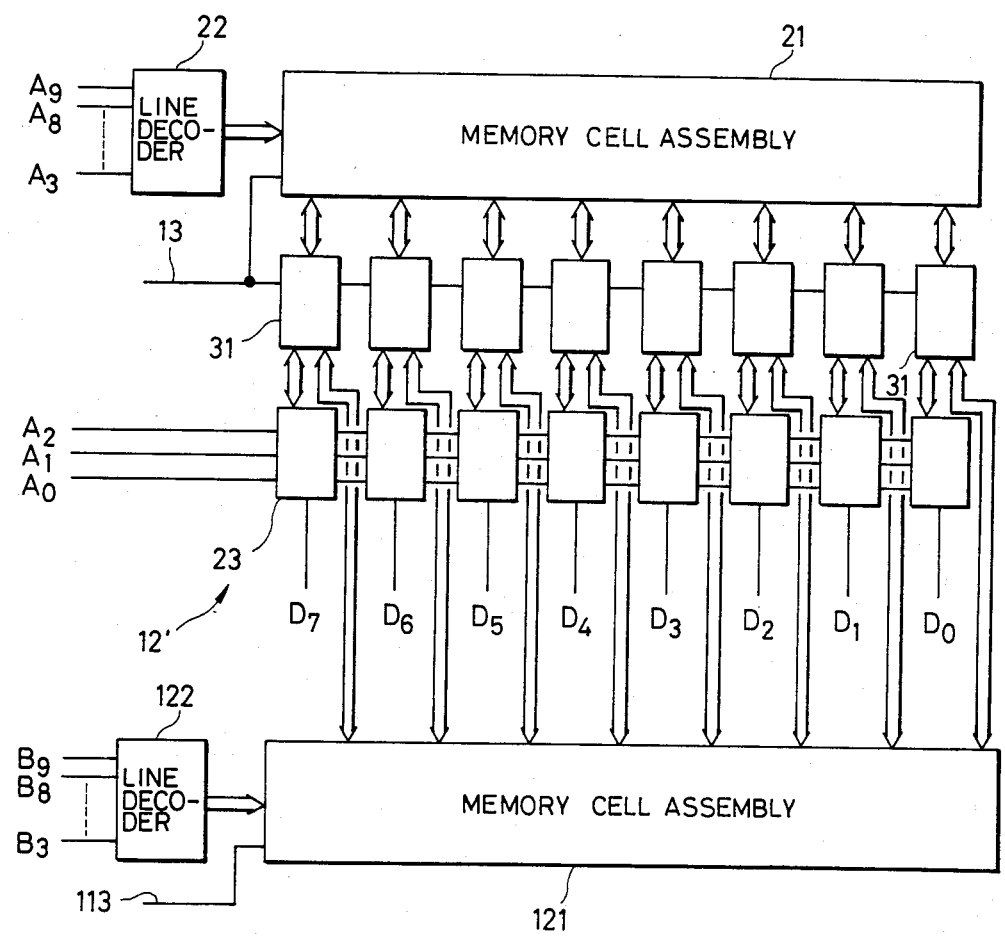
FIG. 5 shows an alternate embodiment of the invention.
Figure 6:
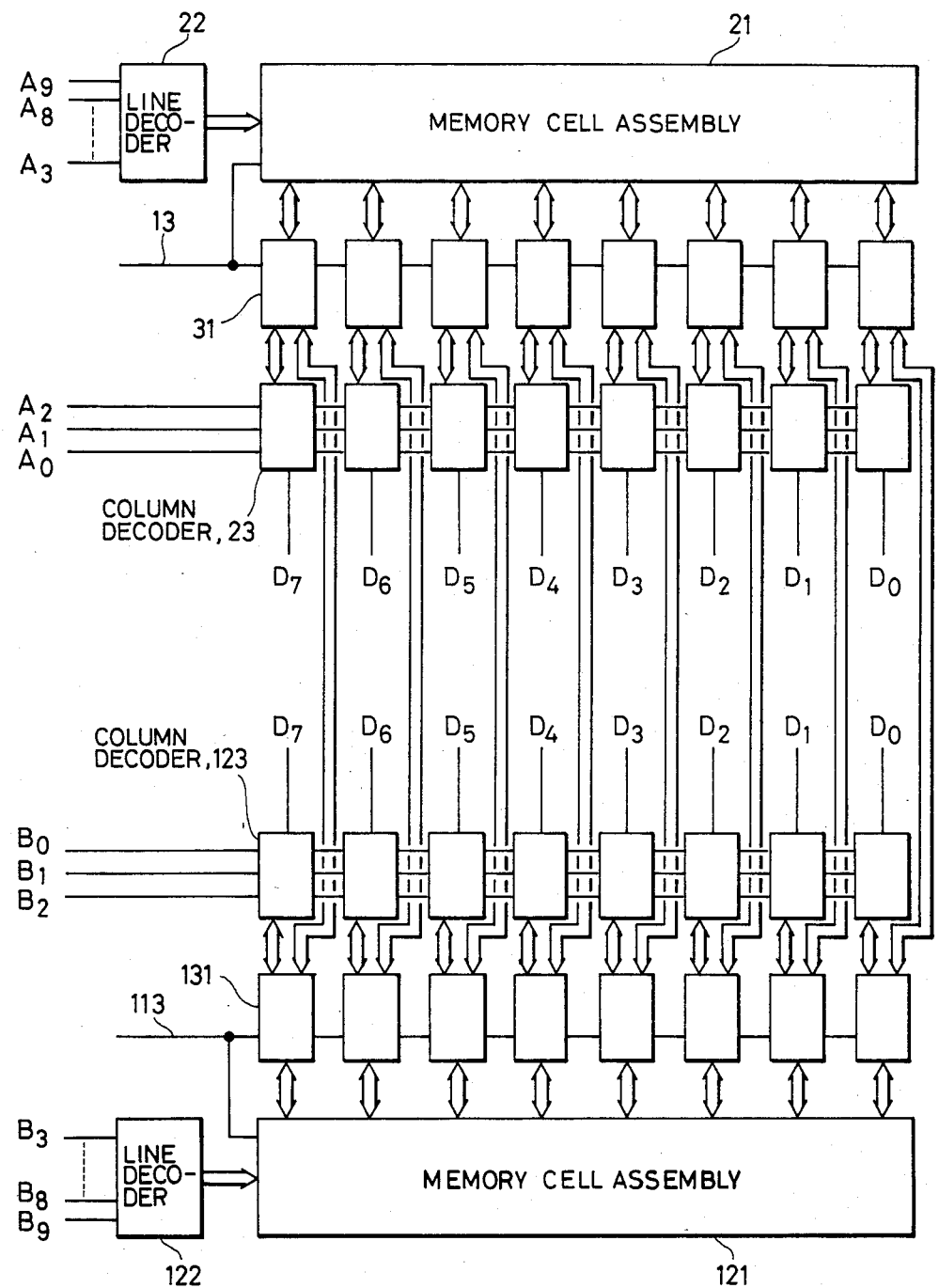
FIG. 6 shows another alternate embodiment of the invention.

Examples of memory arrangements to implement this invention for data transfer between memories appear in FIGS. 5 and 6. In FIG. 5, elements 21, 22, 23, 31 are as described above. Memory cell assembly 121, connected to control line 113 can be similar to memory cell 21 and control line 23, although the number of rows or lines may differ. Line decoder 122 is, in the same manner, similar to decoder 22. The registers 31 are not only connected to assembly 21, they are also connected to memory cell assembly 121. Lines of memory assemblies 21 and 121 can be exchanged in one transfer. Assembly 121 also uses column decoders 23 to communicate with data bus 15.

To effect the transfer of a line of data from memory cell assembly 21 to assembly 121, line decoder 22 first selects a line based on signals A3–A9 and the 6 bits of that line are read out and latched into registers 31 under the control of control line 13. A row or line decoder 122 receives the seven most significant bits of the address, bits B3 . . . . B9, to select one of 128 rows in assembly 121, to receive the 64 bits. Control line 113 causes the 64 bits to be written into assembly 121 in parallel to complete the transfer.

FIG. 6 differs from FIG. 5 in that instead of being connected directly to registers 31, memory cell assembly 121 is connected to registers 131, which are similar to registers 31. Control line 113, which is similar to line 13, controls registers 131 and assembly 121. Registers 131 are also coupled to data bus 15 via column decoders 123 which are similar to decoders 23. Each of the column decoders 123 receives three least significant bits of the address, bits B0, B1, B2, to select one out of the eight columns. Registers 131 and 31 are connected together. When a line of 64 bits from memory cell assembly 21 is outputted from registers 131 as indicated above, it appears at the input of register 131. Control line 113 causes that line to be latched into registers 131 and, after row or line decoder 122 receives the seven most significant bits of the address, bits B3–B9, to select one of the 128 rows in assembly 121, the stored line is inputted to assembly 121 for storage in the selected line.

As is apparent from the above description, according to the invention, data larger than the width of the data bus can be transferred at one time, and therefore even an electronic processing equipment using a simple computer system can process a large quantity of data in a short period of time.

What is claimed is:

1. A high speed memory data transfer method for a word-organized memory arranged by rows and columns and having for each row N columns and P bits per word, said method comprising the steps of:
    (a) selecting a first row of said memory having data to be transferred to a second row of said memory, said second row being different from said first row;
    (b) transferring all N×P bits in said first row of memory to a set of P registers each having N words;
    (c) selecting said second row of said memory to receive said transferred data; and
    (d) transferring the contents of all said P registers to said second row of said memory.

2. The method of claim 1 wherein said transferring steps each include the step of effecting a parallel data transfer.

3. The method of claim 1 wherein said selecting steps each include the step of enabling a row decoder of said memory with selected portion of an address for said memory.

4. The method of claim 1 wherein said first transferring step includes the step of sending a read signal to said memory and wherein said second transferring step includes the step of sending a write signal to said memory.

5. A method for high speed data transfer between a first and second word-organized memories arranged according to rows and columns, each said memory having for each row N columns and P bits per word, said method comprising the steps of:
    (a) selecting a first row of said first memory, said first row having data to be transferred;

(b) transferring all N×P bits in said first row of said first memory into a set of P registers each having N words;

(c) selecting a second row of said second memory to receive said transferred data; and (d) transferring the contents of all said P registers into said second row of said second memory.

6. The method of claim 5 wherein said set of P registers of N words includes first and second P register sets of N words per register and wherein said method further includes the step of transferring the contents of said first register set to said second register set.

7. The method of claims 5 or 6 wherein said transferring steps each include the step of effecting a parallel data transfer.

8. The methods of claims 5 or 6 wherein said selecting steps each include the step of enabling a row detector with selected portions of an address for said memory.

9. The methods of claims 5 or 6 wherein said step of transferring data from said first memory includes the step of sending a read signal to said first memory and wherein said step of transferring data to said second memory includes the step of sending a write signal to said second memory.

10. A memory addressed by an address word comprising:

a word-organized memory cell assembly arranged as M rows by N words with P bits per word;

a row decoder coupled to said memory cell assembly and enabled by certain bits of said address word;

P registers of N words, coupled to said memory cell assembly to receive the data from an entire row of said memory selected by said row decoder and to present for input the data in an entire row of said memory selected by said row decoder; and P column decoders enabled by certain bits of said address word for transferring P-bit data between said P registers and a P-bit data bus.

11. A memory arrangement comprising:

(a) a first memory addressed by a first address word said first memory including;

(i) a first word-organized memory cell assembly arranged as M rows by N columns with P bits per word, and (ii) a first row decoder coupled to said first memory cell assembly and enabled by certain bits of said first address word;

(b) a second memory addressed by a second address word, said second memory including (i) a second word-organized memory cell assembly arranged as M' rows by N columns and P bits per word, and (ii) a second row decoder coupled to said second memory cell assembly and enabled by certain bits of said second address word; and (c) P registers of N words coupled to said first memory cell assembly to receive an entire row of said first memory selected by said first row decoder and to present for input to said second memory an entire row selected by said second row decoder; and (d) P column decoders enabled by certain bits of said second address word for transferring P-bit data between said P registers and a P-bit data bus.

12. A memory arrangement comprising:

(a) a first memory addressed by a first address word, said first memory including (i) a first word-organized memory cell assembly arranged as M rows by N columns with P bits per word, (ii) a first row decoder coupled to said first memory cell assembly and enabled by certain bits of said first address word, and (iii) a first set of P registers of N words coupled to said first memory cell assembly to transfer an entire row of said first memory selected by said first row decoder; and (b) a second memory addressed by a second address word, said second memory including (i) a second word-organized memory cell assembly arranged as M' rows by N columns with P bits per word, (ii) a second row decoder coupled to said second memory cell assembly and enabled by certain bits of said second address word, (iii) a second set of P registers of N words coupled to said second memory cell assembly to transfer an entire row of said second memory selected by said second row decoder and coupled to transfer data with said first P register set; and (c) P column decoders enabled by certain bits of said second address word for transfering P-bit data between said second set of P registers and a P-bit data bus.

* * * * *